United States Patent
Babcock et al.

(10) Patent No.: US 7,061,057 B2
(45) Date of Patent: Jun. 13, 2006

(54) LATERALLY DIFFUSED MOS TRANSISTOR HAVING N+ SOURCE CONTACT TO N-DOPED SUBSTRATE

(75) Inventors: Jeff Babcock, Sunnyvale, CA (US); Johan Agus Darmawan, Cupertino, CA (US); John Mason, Sunnyvale, CA (US)

(73) Assignee: Cree Microwave, LLC, Durham, NC (US)

( * ) Notice: Subject to any disclaimer, the term of this patent is extended or adjusted under 35 U.S.C. 154(b) by 0 days.

(21) Appl. No.: 10/870,720

(22) Filed: Jun. 16, 2004

(65) Prior Publication Data

US 2005/0280101 A1    Dec. 22, 2005

(51) Int. Cl.
*H01L 29/76* (2006.01)

(52) U.S. Cl. .............. 257/401; 257/342; 257/328; 257/329; 257/344; 257/408; 257/330

(58) Field of Classification Search .......... 257/342, 257/401, 328, 329, 344, 408, 330
See application file for complete search history.

(56) References Cited

U.S. PATENT DOCUMENTS

| | | | |
|---|---|---|---|
| 5,869,875 A | 2/1999 | Hebert | 257/328 |
| 6,864,533 B1 * | 3/2005 | Yasuhara et al. | 257/342 |

* cited by examiner

*Primary Examiner*—Mai-Huong Tran
(74) *Attorney, Agent, or Firm*—Beyer Weaver & Thomas LLP

(57) ABSTRACT

Reduced source resistance is realized in a laterally diffused MOS transistor by fabricating the transistor in a P-doped epitaxial layer on an N-doped semiconductor substrate and using a trench contact for ohmically connecting the N-doped source region to the N-doped substrate.

22 Claims, 14 Drawing Sheets

LATERALLY DIFFUSED MOS TRANSISTOR HAVING N+ SOURCE CONTACT TO N-DOPED SUBSTRATE

CROSS-REFERENCE TO RELATED APPLICATION

This application is related to co-pending applications Ser. No. 10/870,753, filed Jun. 16, 2004, entitled LDMOS TRANSISTOR WITH IMPROVED GATE SHIELD, Ser. No. 10/870,012, filed Jun. 16, 2004, entitled LDMOS TRANSISTOR HAVING GATE SHIELD AND TRENCH SOURCE CAPACITOR, and Ser. No. 10/870,795, filed Jun. 16, 2004, entitled LATERALLY DIFFUSED MOS TRANSISTOR HAVING INTEGRAL SOURCE CAPACITOR AND GATE SHIELD, all of which are incorporated herein by reference for all purposes.

BACKGROUND OF THE INVENTION

This invention relates generally to semiconductor transistors, and more particularly the invention relates to laterally diffused MOS (LDMOS) transistors.

The LDMOS transistor is used in RF/microwave power amplifiers. The device is typically fabricated in an epitaxial silicon layer (P−) on a more highly doped silicon substrate (P+). A grounded source configuration is achieved by a deep P+ sinker diffusion from the source region to the P+ substrate, which is grounded. (See, for example, U.S. Pat. No. 5,869,875.)

The source resistance of the LDMOS transistor is determined in part by the mobility of positive carriers, or holes, in the P+ substrate. The source resistance is also sensitive to the drain-source voltage (Vds) and its effects. Further, a gold backside contact to the P+ substrate can require expensive preform compounds during packaging to maintain low source resistance.

The present invention is directed to reducing or eliminating these characteristics with conventional LDMOS transistors.

SUMMARY OF THE INVENTION

In accordance with the present invention, a LDMOS transistor is fabricated on an N-doped substrate having a P-doped epitaxial layer grown on the substrate with a buried P-doped layer in the epitaxial layer. The transistor is fabricated in the P-doped epitaxial layer.

A source contact is provided through the epitaxial layer and buried layer to the N-doped substrate. The contact also ohmically engages a P-doped channel region and a P+ sinker, if present. Thus, the electrical carriers are now electrons in the N-doped substrate rather than holes in a P-doped substrate. Since electrons have higher mobility in a semiconductor than do holes, the source resistance is reduced. Further, a gold backside contact to the N-doped substrate is readily made without the need for preform compounds. Additionally, the drain extension region (the epitaxial layer and P buried layer) allows electrical junction isolation of the drain from the body and source contact.

The invention and objects and features thereof will be more readily apparent when the following detailed description and appended claims when taken with the drawings.

DETAILED DESCRIPTION OF THE ILLUSTRATE EMBODIMENTS

Figure 1:
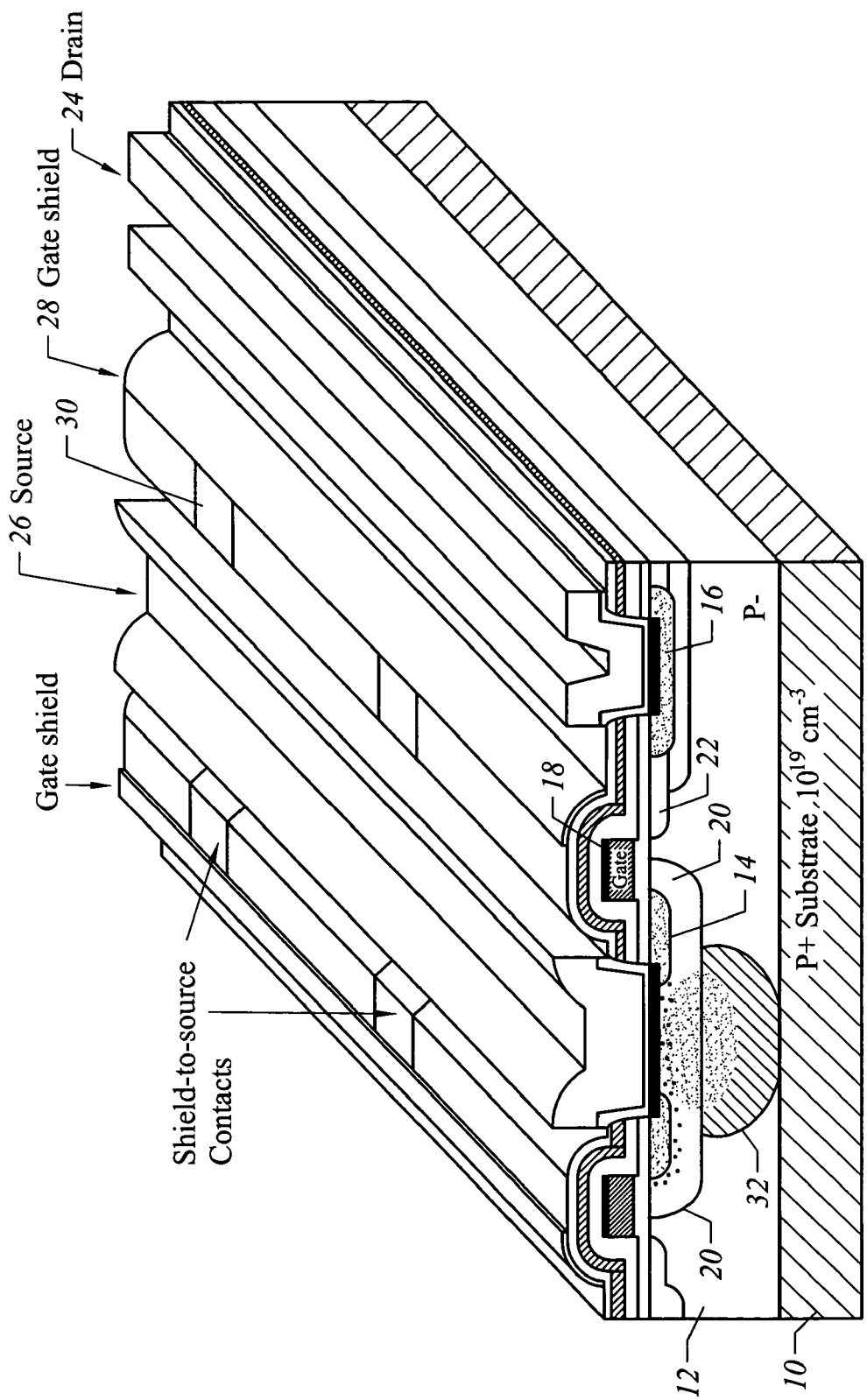
FIG. 1 is a perspective view of a LDMOS transistor formed on a P-doped substrate with a source region and source contact.

FIG. 1 is a perspective view of a LDMOS transistor. The transistor is fabricated on a P-doped substrate 10 in accordance with the prior art. A P− doped epitaxial layer 12 is formed on a P+ substrate 10 with the transistor structure fabricated in and on epitaxial layer 12. The transistor comprises a N-doped source region 14, a N-doped drain region 16, a gate 18 formed over and spaced from P− channel region 20 by a silicon oxide. A lightly doped drain drift region 22 extends from gate 18 to drain 16. A metal drain contact 24 contacts drain 16 and metal contact 26 contacts source 14 and an extension of the P-doped channel region 20. In this embodiment a gate shield 28 provides shielding between gate 18 and drain contact 24, and gate shield 28 is ohmically connected with source electrode 26 through conductive ribs 30.

Source contact 26 ohmically contacts N-doped source region 14 and an extension of P− doped channel region 20 and ohmically contacts P+ substrate 10 through a P+ doped sinker 32 which extends through P-doped epitaxial layer 12 to P+ substrate 10. A source contact can be provided for the transistor on the backside of substrate 10. P+ sinker 32 is not needed in a low power application but helps prevent a depletion region from the drain the sinker can be formed by out diffusion from the trench contact.

It is desirable to have the source resistance as low as possible. As noted above, source resistance of the LDMOS transistor is determined in part by the mobility of positive carriers, or holes, in P+ substrate 10. The source resistance is also sensitive to the drain-source voltage (Vds) and its effects. Further, a metal such as a gold backside contact to P+ substrate 10 can require expensive preform compounds during packaging to maintain low source resistance.

Figure 2:
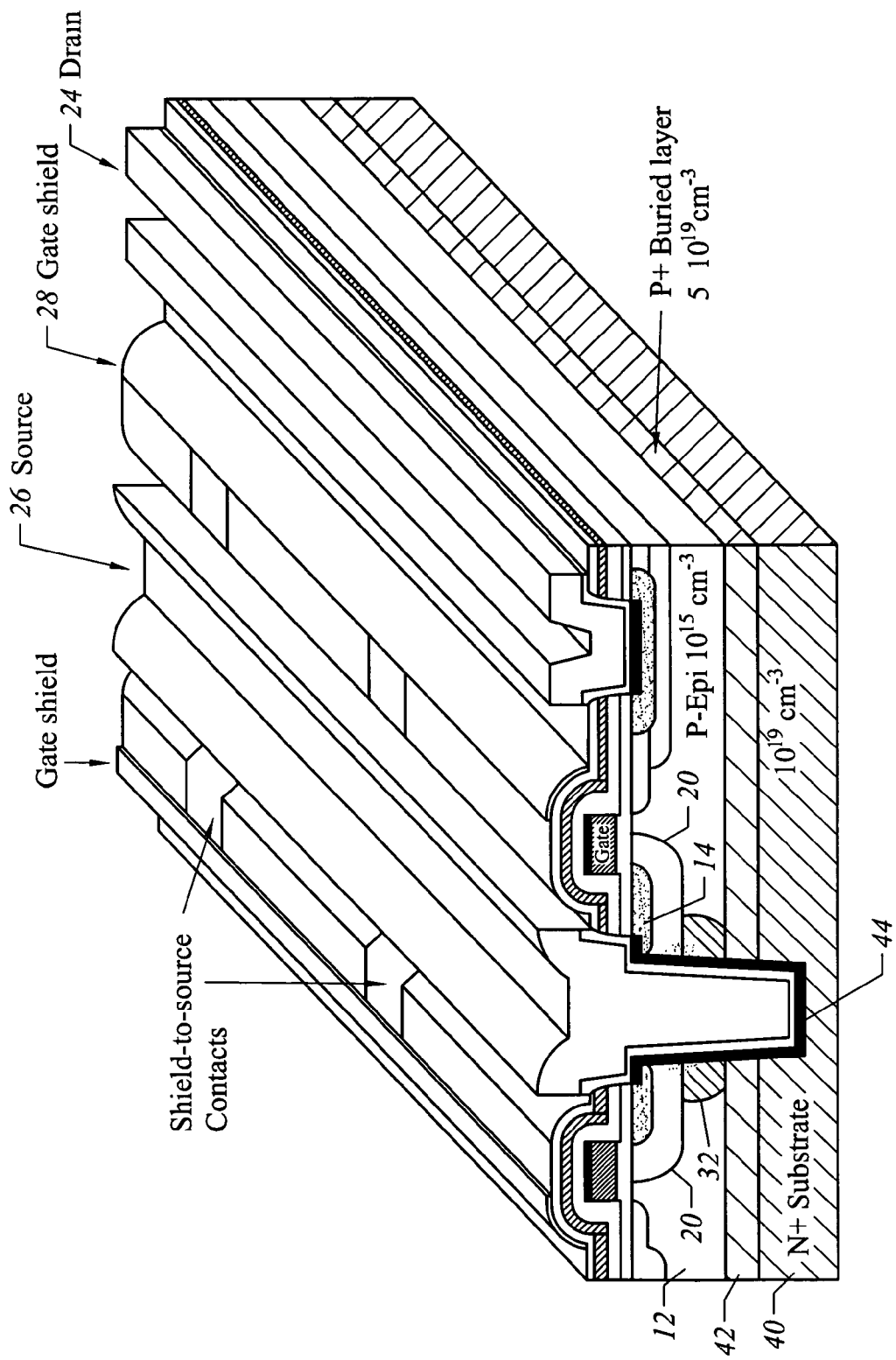
FIG. 2 is a perspective view of a LDMOS transistor with a n-doped substrate and a source region and source contact in accordance with an embodiment of the invention.

FIG. 2 is a perspective view of one embodiment of a LDMOS transistor in accordance with the invention which reduces or overcomes the adverse effects on source resistance in the conventional LDMOS transistor structure using a P+ substrate. Like elements of the transistors in FIGS. 1 and 2 have the same reference numerals. In this embodiment, the P+ substrate 10 is replaced by an N+ substrate 40 and P+ substrate 10 of FIG. 1 in effect becomes a P+ buried layer 42 in P-epitaxial layer 12 as shown in FIG. 2. In order for source contact 26 to ohmically contact N+ substrate 40, a trench is etched through a central portion of P− region 20 and the underlying P+ sinker region 32 into N+ substrate 10, and then the groove is filled with conductive material including a metal silicide 44 and the metal source contact 26. Source contact 26 and silicide layer 44 ohmically contact source region 14 as in the prior art structure of FIG. 1.

Fabrication of the N+ source trench contact to the underlying N+ substrate is readily implemented using conventional semiconductor processing. FIGS. 3A–3K are section views illustrating the fabrication of the trench contact after the source region 14, drain region 16, channel region 20, gate 18, and drift region 22 have been fabricating using conventional semiconductor processing. While not part of the invention, it will be noted that drain region 16 includes a highly doped surface region for contact purposes, and underlying N-doped region, and the N– drift region 22. Further, the lightly doped channel region 20 extends from under gate 18 to an adjacent transistor and under its gate 18'. Source region 14 extends to the adjacent transistor, also, with the source contact (to be fabricated) shared by both adjacent transistors.

Figure 3A:
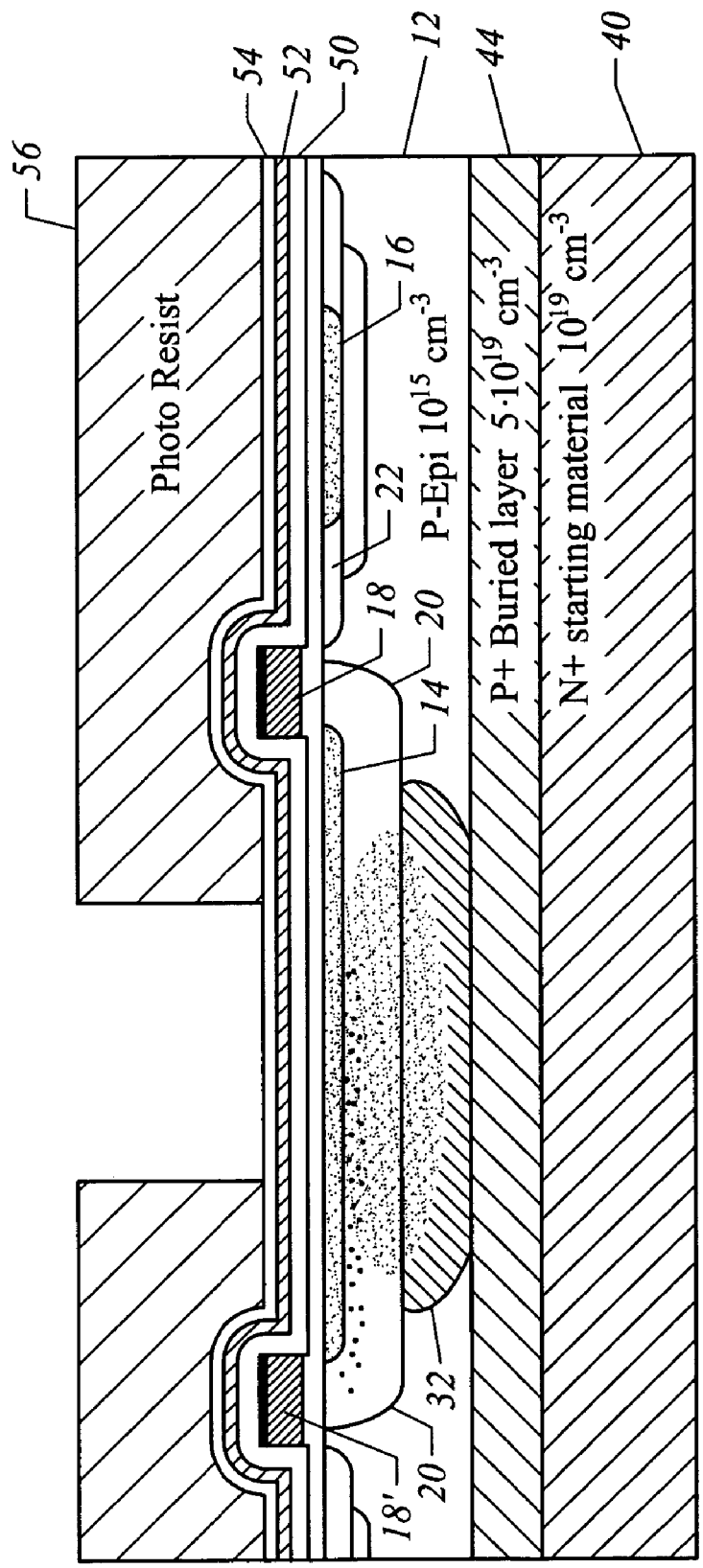
FIGS. 3A–3L are section views illustrating the formation of a trench source contact to the n-doped substrate of the LDMOS transistor in FIG. 2.
Figure 3B:
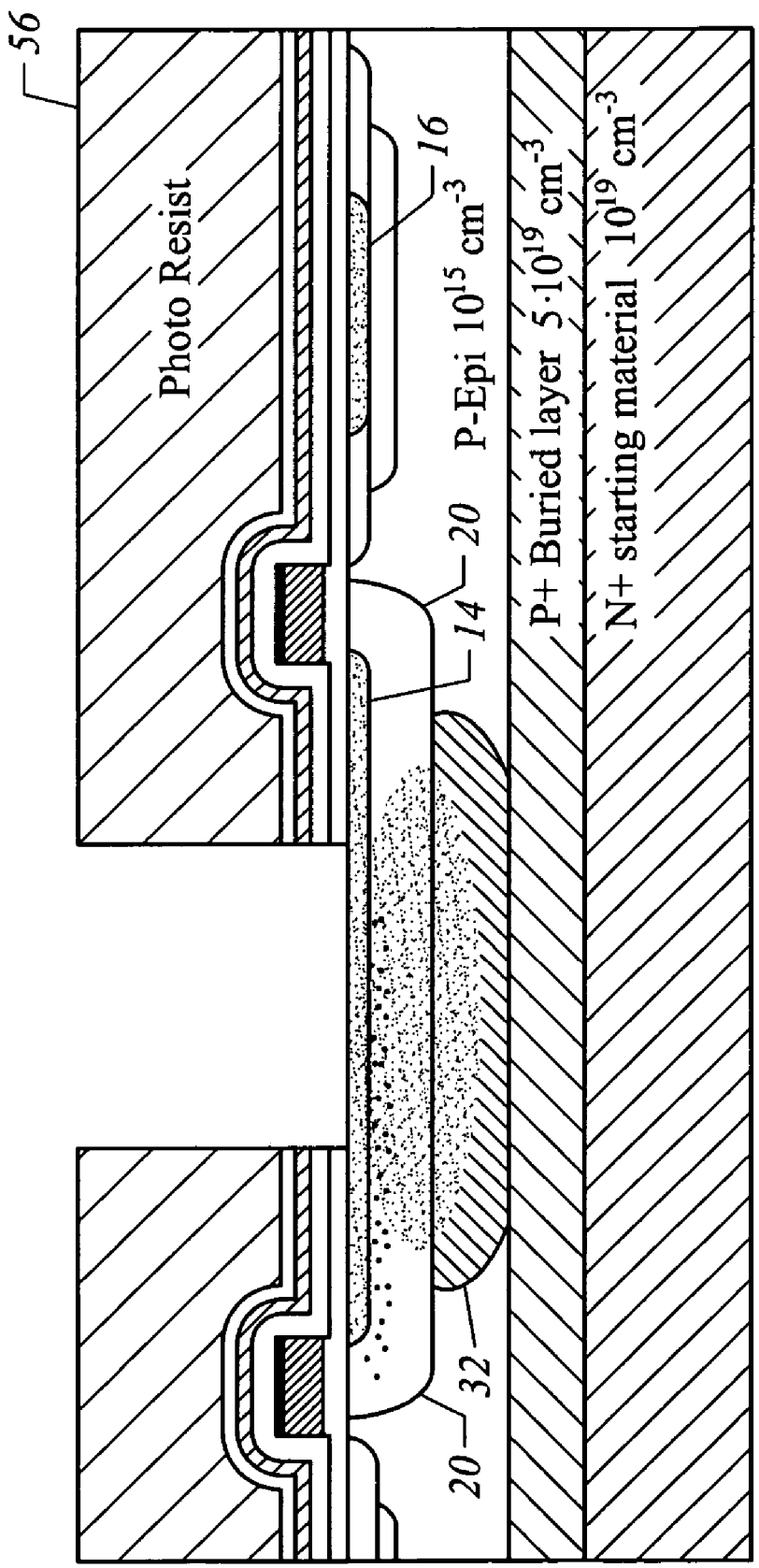
Figure 3C:
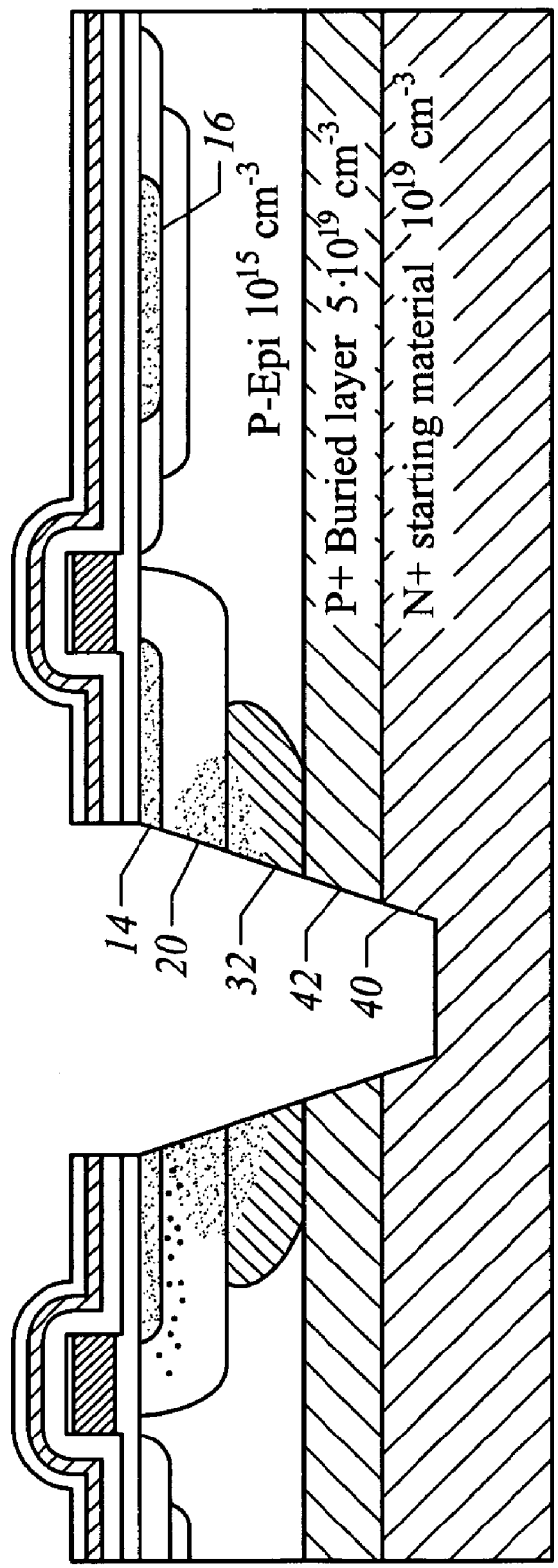

In FIG. 3A surface layers of silicon oxide 50, silicon nitride 52, and silicon oxide 54 have been fabricated over the surface of the transistor structure. A photoresist mask 56 is formed over the surface layers, and as shown in FIG. 3B silicon oxide layers 50, 54 and silicon nitride 52 are removed by etching over source region 14. Resist 56 is then stripped and the exposed silicon is then selectively etched through source region 14, channel region 20, P+ sinker region 32 (if present), P+ layer 42, and into N+ substrate 40, as shown in FIG. 3C.

Figure 3D:
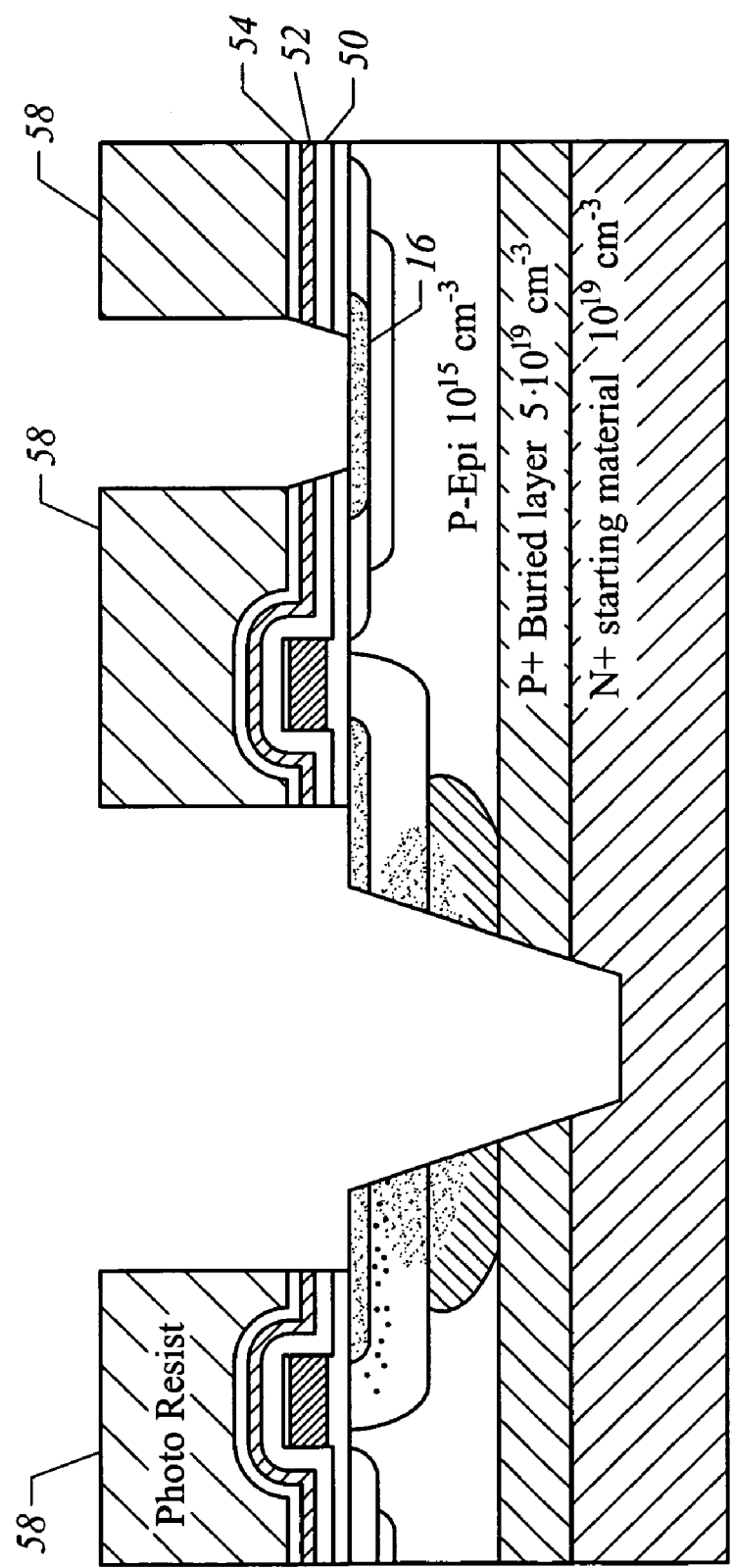
Figure 3E:
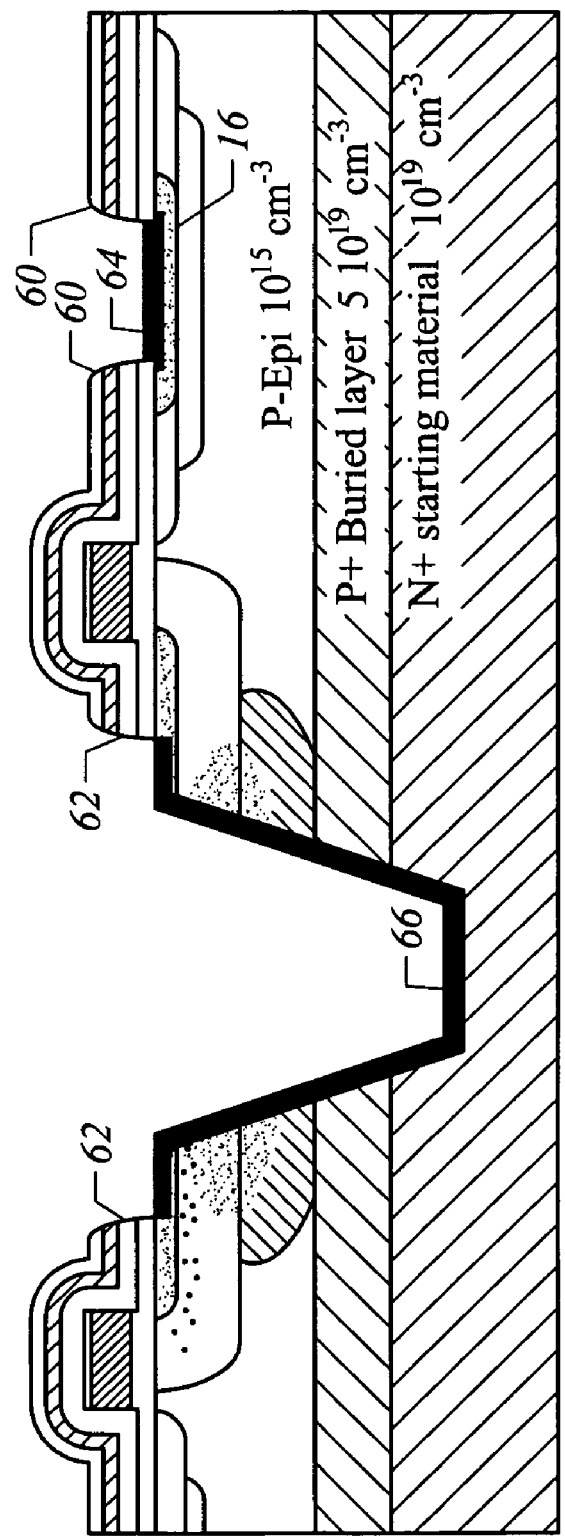
Figure 3F:
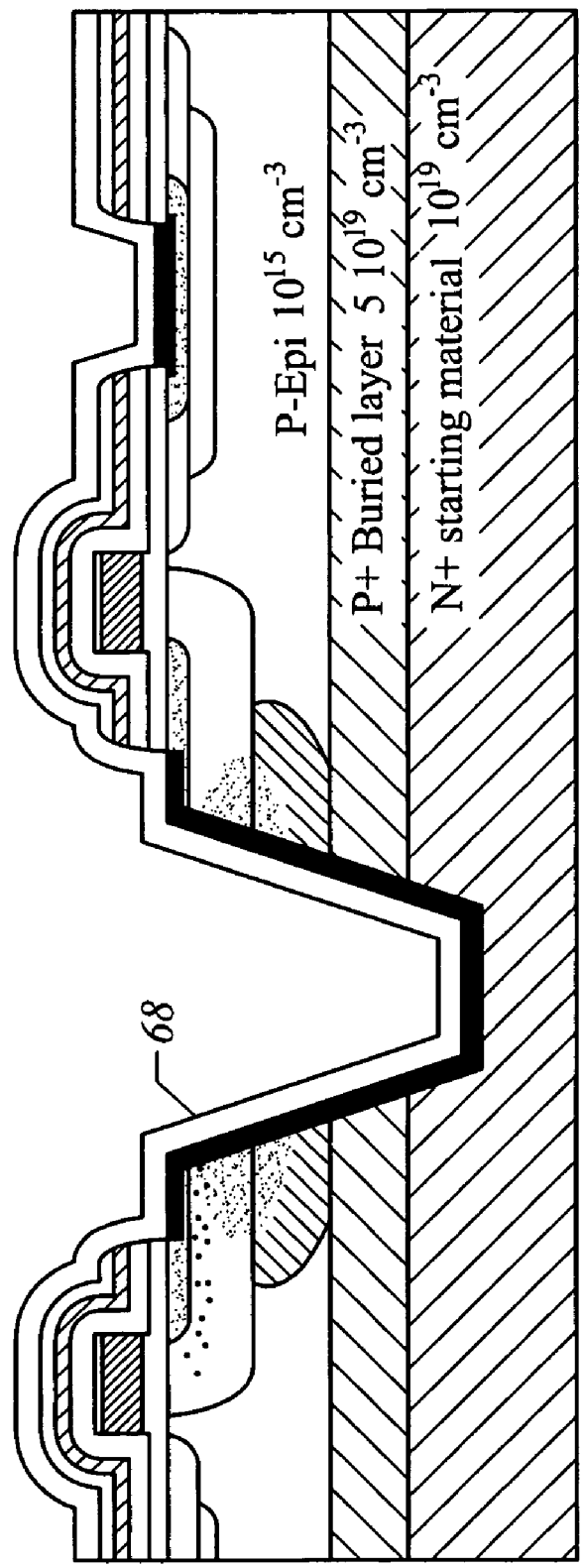
Figure 3G:
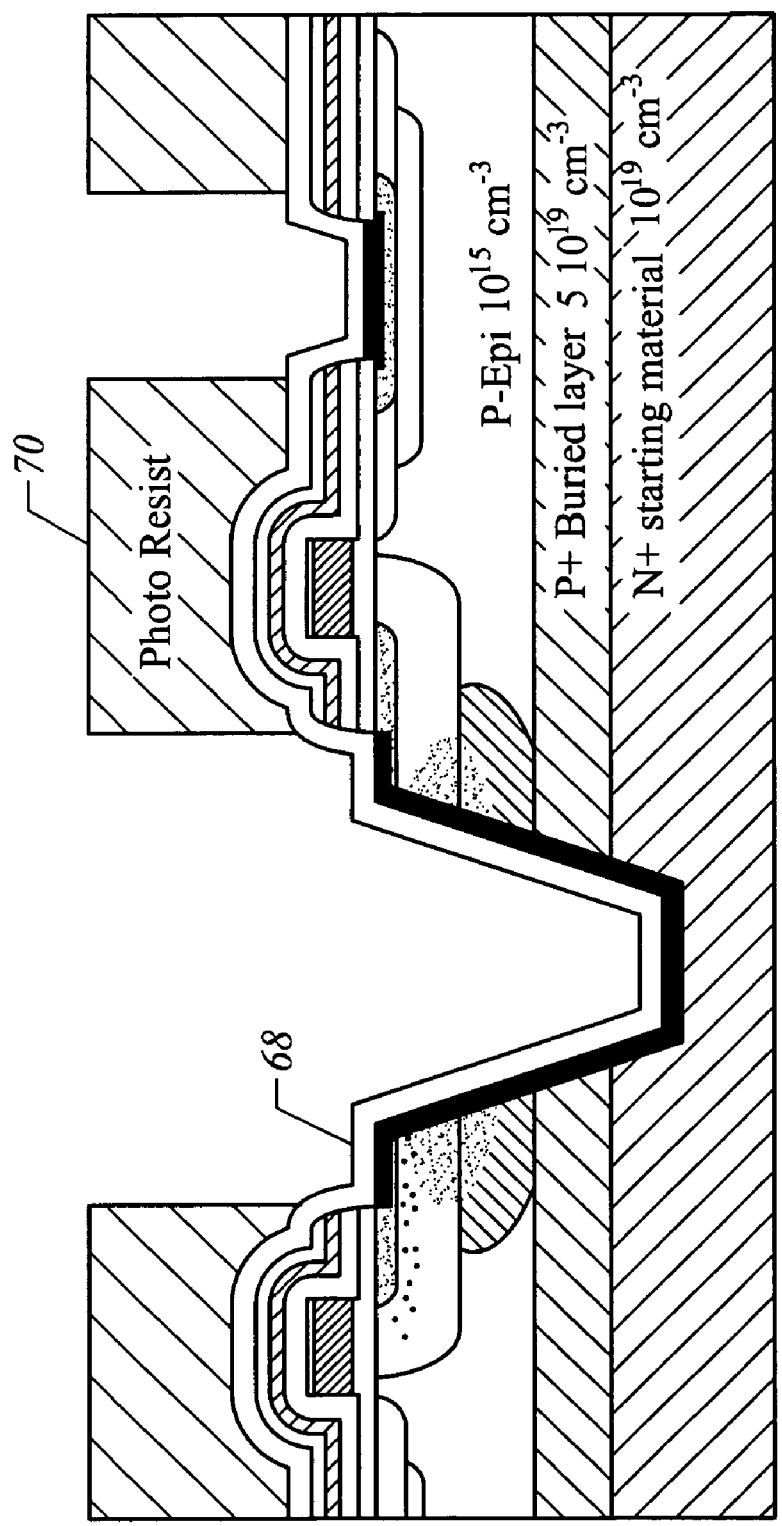
Figure 3H:
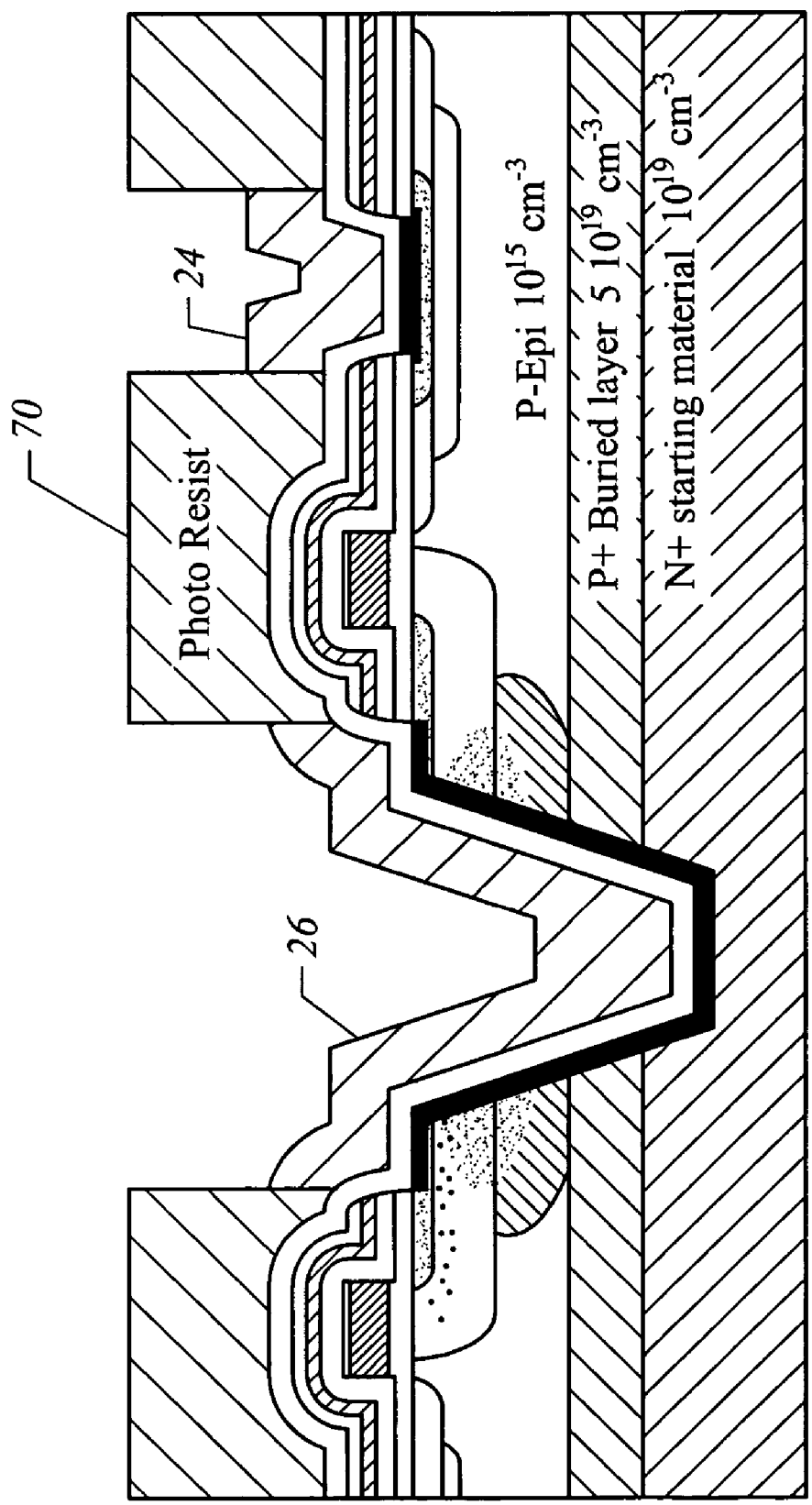

In FIG. 3D, photoresist mask 58 is formed over the surface, and the oxide layers 50, 54 and nitride layer 52 above drain 16 are removed by etching, and then a thin layer of exposed silicon (e.g., 100 Å) is etched from the exposed source contact region and the drain contact region. In FIG. 3E, a silicon oxide deposition and etch back provides silicon oxide spacers 60 for the drain contact area and spacers 62 for the source contact area. However, use of spacers is not required in practicing the process. A silicide contact 64 is formed on the surface of drain 16, and silicide contact 66 is formed on the surface of the groove for the source contact. Thereafter, as shown in FIG. 3F, a metal layer 68 (TiW—TiWN—TiW) is formed over the surface of the structure and includes a gold seed layer for subsequent gold deposition and also provides a shield structure for the gate. In FIG. 3G, a photoresist mask 70 is formed over the surface, and then gold is plated onto the exposed gold seed layer of metal layer 68 to form source contact 26 and drain contact 24, as shown in FIG. 3H. The plated gold does not stick to the photoresist mask.

Figure 3I:
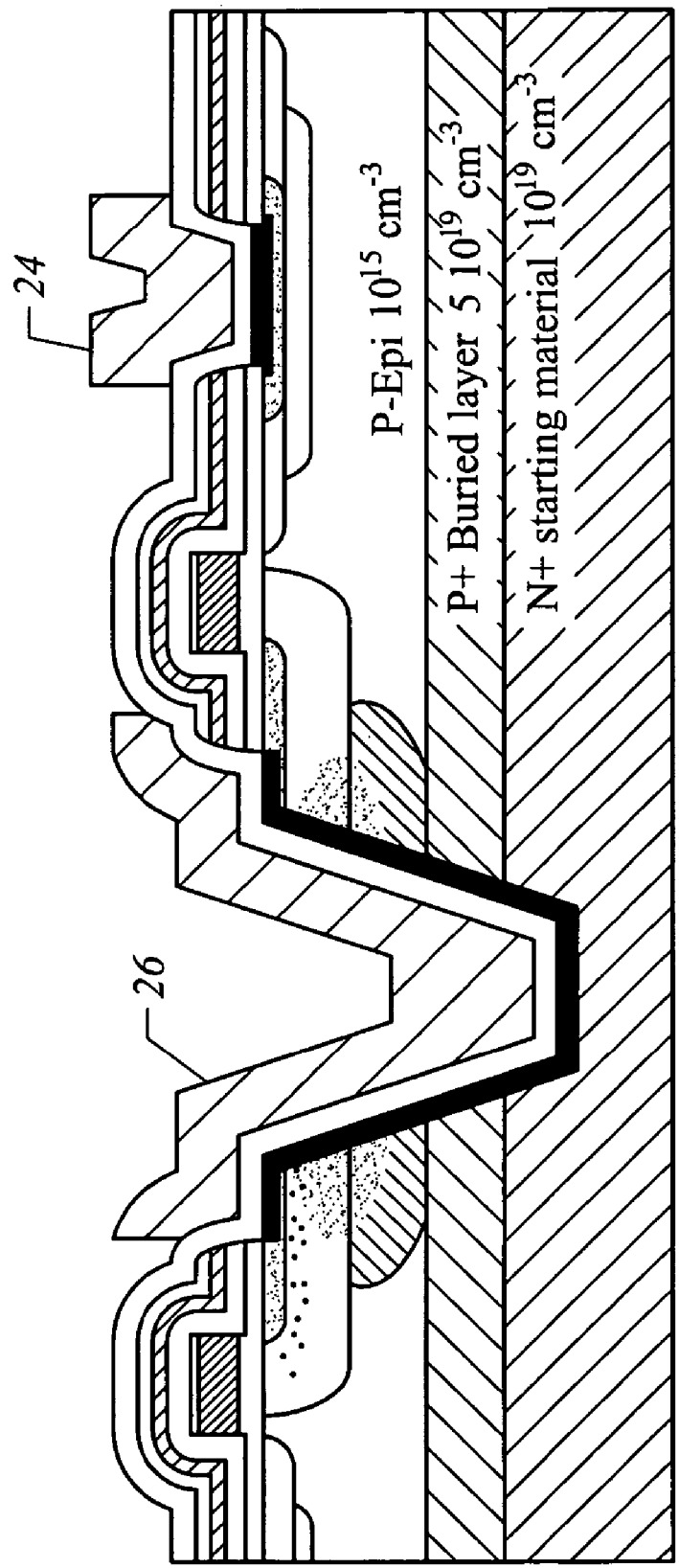
Figure 3J:
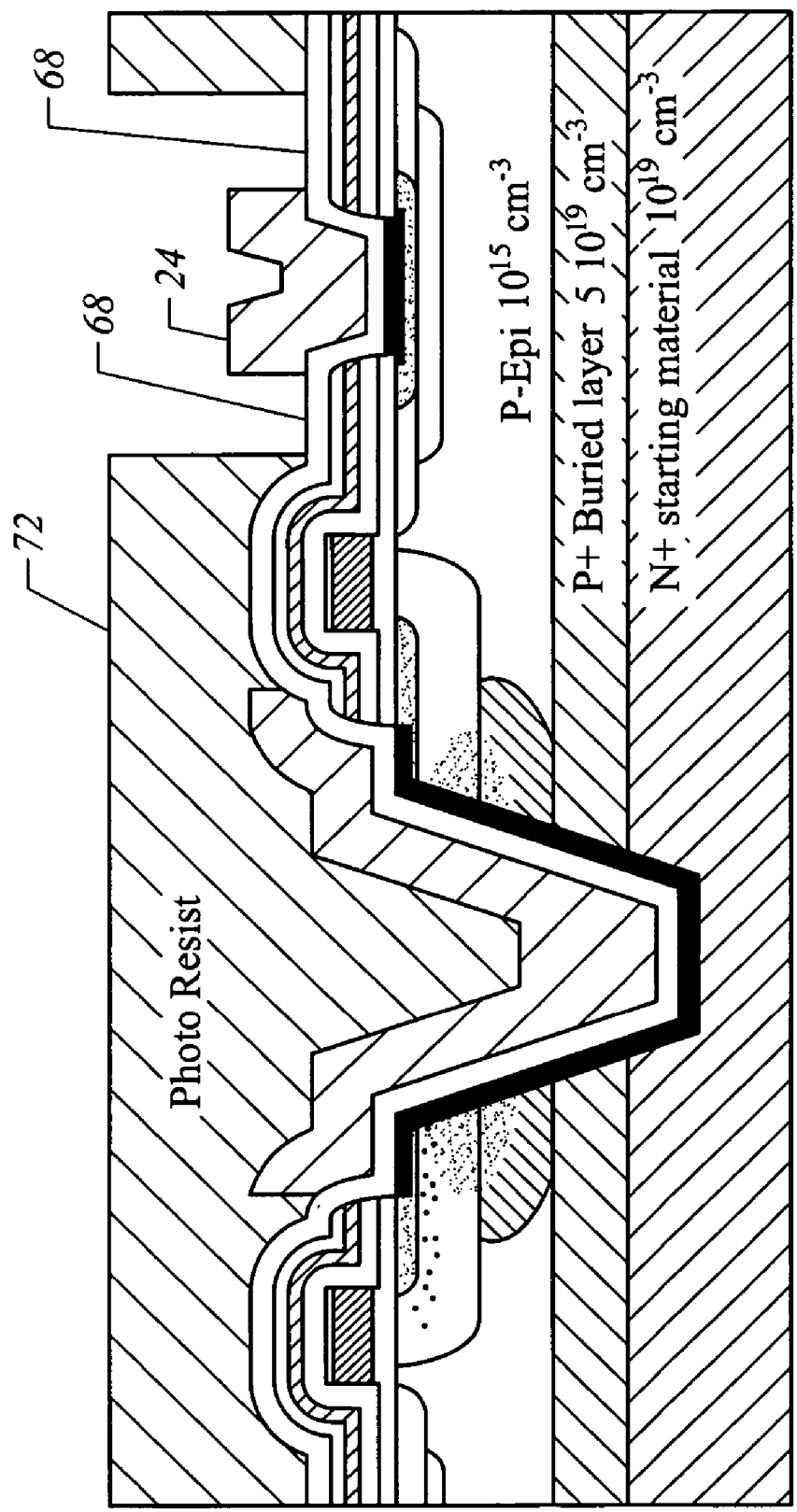
Figure 3K:
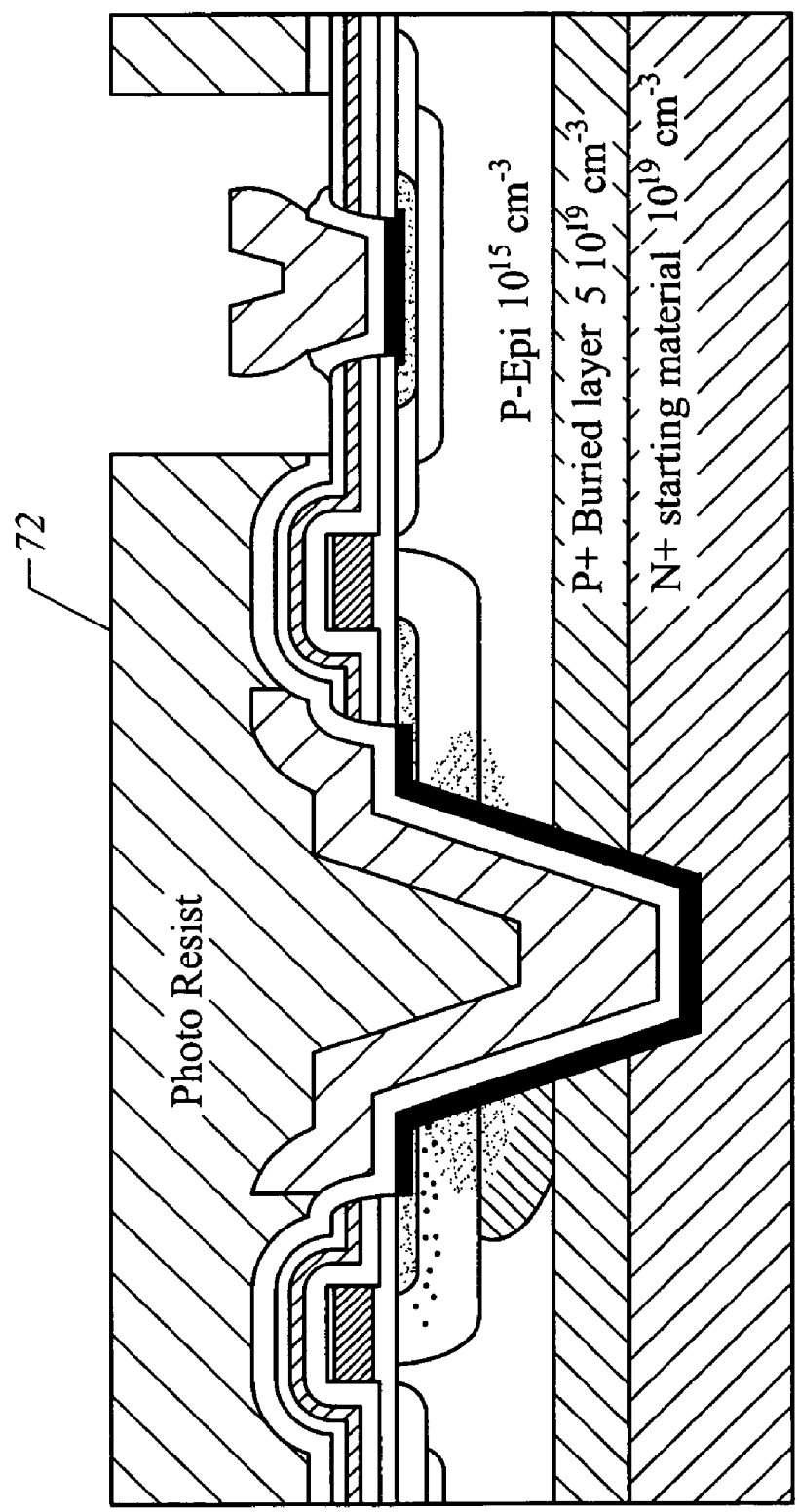
Figure 3L:
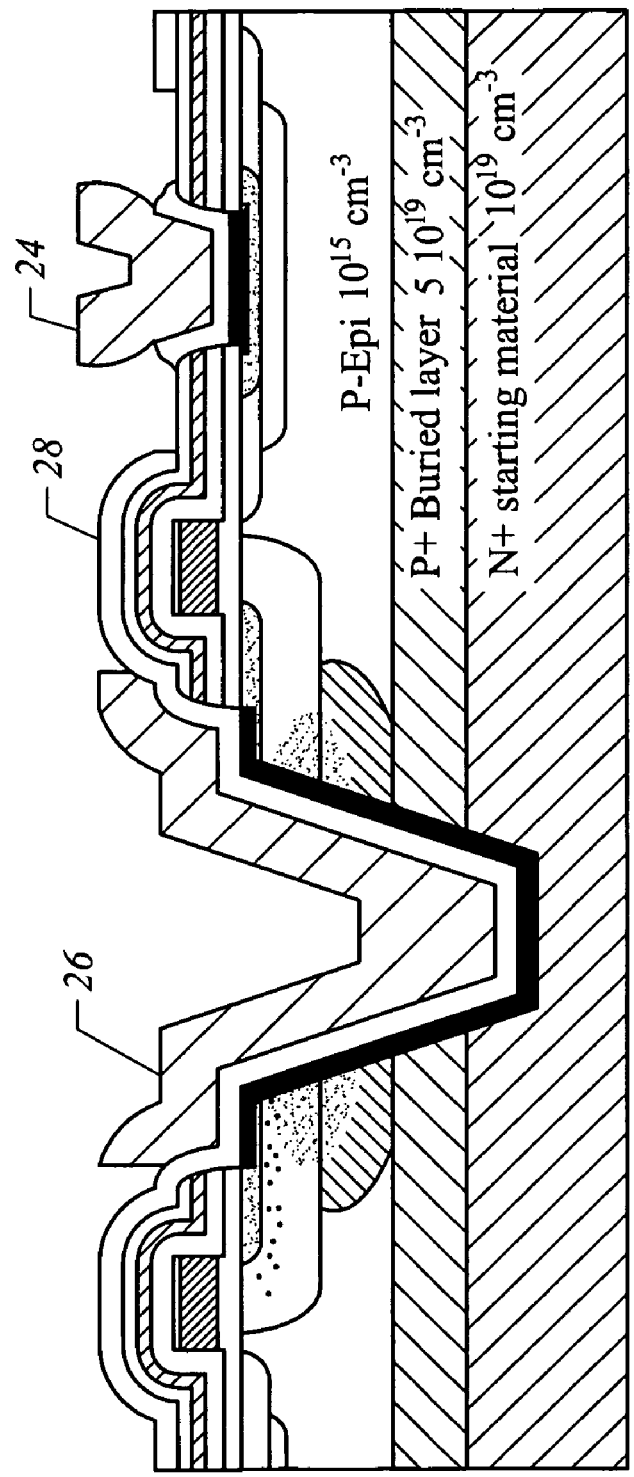

Photoresist mask 70 is removed as shown if FIG. 3I, and then as shown in FIG. 3J another photoresist mask 72 is formed over the surface to expose selected portions of metal layer 68 abutting drain contact 24, which is then removed by etching as shown in FIG. 3K. Mask 72 is then removed as shown in FIG. 3L with the LDMOS transistor and contact structures completed. The portion of metal layer 68 over gate 18 and facing drain contact 24 functions as a gate shield in this embodiment.

The use of an N+ substrate in the LDMOS structure provides advantages in reducing source contact resistance as described above. While the invention has been described with reference to a specific embodiment, the description is illustrative of the invention, and is not to be construed to be as limiting of the invention. Various modifications and applications may occur to those skilled in the art without departing from the true spirit and scope of the invention as defined by the appended claims.

What is claimed is:

1. A LDMOS transistor comprising:
a) a N-doped substrate,
b) a P-doped epitaxial layer on the N-doped substrate with a P+ doped buried layer in the epitaxial layer,
c) a gate electrode on a dielectric layer on the surface of the P-doped epitaxial layer and over a P-doped channel region in the P-doped epitaxial layer,
d) a N-doped drain region in the P-doped epitaxial layer extending from one side of the gate electrode,
e) a N-doped source region in the P-doped epitaxial layer extending from an opposing side of the gate electrode, and
f) a source contact extending through the P-doped epitaxial layer and the P+ buried layer into the N-doped substrate and connecting the N-doped source region to the N-doped substrate.

2. The LDMOS transistor as defined by claim 1 wherein the source contact electrically contacts the N-doped source region and the P-doped channel region.

3. The LDMOS transistor as defined by claim 2 and further including a backside source contact on a surface of the N-doped substrate.

4. The LDMOS transistor as defined by claim 3 wherein the source contact is formed in a groove extending from the surface of the P-doped epitaxial layer through the P-doped epitaxial layer and the P+ doped buried layer to the N-doped substrate, and includes a metal silicide layer formed on the surface of the groove and a filler metal filling the groove.

5. The LDMOS transistor as defined by claim 4 wherein the filler metal comprises gold.

6. The LDMOS transistor as defined by claim 5 wherein the metal silicide comprises a refractory metal silicide.

7. The LDMOS transistor as defined by claim 6 and further including a gate shield overlying a portion of the gate electrode facing the N-doped drain region.

8. The LDMOS transistor as defined by claim 7 wherein the gate shield is electrically connected to the source contact.

9. The LDMOS transistor as defined by claim 8 wherein the gate electrode is electrically connected to the source contact by conductive ribs overlying the gate contact.

10. The LDMOS transistor as defined by claim 9 and further including a drain contact to the N-doped drain region.

11. The LDMOS transistor as defined by claim 10 wherein the N-doped drain region includes a lightly-doped drain region extending from a more heavily doped drain region to the channel region, the drain contact engaging the more heavily doped drain region.

12. The LDMOS transistor as defined by claim 4 and further including a gate shield overlying a portion of the gate electrode facing the N-doped drain region.

13. The LDMOS transistor as defined by claim 12 wherein the gate shield is electrically connected to the source contact.

14. The LDMOS transistor as defined by claim 13 and further including a drain contact to the N-doped drain region.

15. The LDMOS transistor as defined by claim 14 wherein the N-doped drain region includes a lightly doped drain region extending from a more heavily doped drain region to the channel region, the drain contact engaging the more heavily doped drain region.

16. A transistor structure comprising:
a) a N-doped semiconductor substrate,
b) a P-doped epitaxial semiconductor layer formed on the substrate, the layer including a buried P-doped layer and having a surface,
c) a source region and a drain region formed in the epitaxial layer with a channel region there between,
d) a gate electrode formed on an insulator above the channel region, and
e) a source contact extending from the surface of the epitaxial layer through the epitaxial layer to the N-doped semiconductor substrate, the source contact including a trench through the epitaxial layer filled with conductive material.

17. The transistor structure as defined by claim 16 wherein the semiconductor substrate is grounded during device operation, the source contact extending ground to the source region.

18. The semiconductor structure as defined by claim 16 wherein the transistor comprises a laterally diffused MOS transistor.

19. The transistor device as defined by claim 18 wherein the drain region includes a heavily doped region and a lighter doped drift region extending to the channel region.

20. The transistor structure as defined by claim 19 wherein the insulator under the gate electrode extends over the drift region.

21. The transistor structure as defined by claim 16 wherein the conductive material is selected from the group consisting of polysilicon, a refractory metal, and a refractory metal silicide.

22. The transistor structure as defined by claim 21 wherein said gate electrode comprises doped polysilicon.

* * * * *